(12) United States Patent
Gielenz et al.

(10) Patent No.: US 6,479,831 B1
(45) Date of Patent: Nov. 12, 2002

(54) PROCESS FOR THE IRRADIATION OF STRAND-SHAPED IRRADIATED MATERIAL, AND AN IRRADIATING DEVICE FOR THE PERFORMANCE OF THE SAID PROCESS

(75) Inventors: Gerhard Gielenz, Wetzikon (CH); Brigitt Schmid, Pfaffhausen (CH)

(73) Assignee: Huber & Suhner AG, Pfaffikon (CH)

( * ) Notice: Subject to any disclaimer, the term of this patent is extended or adjusted under 35 U.S.C. 154(b) by 0 days.

(21) Appl. No.: 09/393,005

(22) Filed: Sep. 9, 1999

(30) Foreign Application Priority Data

Sep. 11, 1998 (DE) .......................... 198 42 477

(51) Int. Cl.[7] .......................... H01J 37/302
(52) U.S. Cl. .......................... 250/492.3
(58) Field of Search .......................... 250/452.3, 452.1

(56) References Cited

U.S. PATENT DOCUMENTS

| | | | | |
|---|---|---|---|---|
| 3,714,416 A | * | 1/1973 | Link et al. ............. | 250/492.3 |
| 3,942,017 A | * | 3/1976 | Uehara et al. .......... | 250/492.3 |
| 5,051,600 A | * | 9/1991 | Schuetz et al. ......... | 250/492.3 |

FOREIGN PATENT DOCUMENTS

| DE | 3442243 C2 | 6/1988 |
|---|---|---|
| DE | 4025182 A1 | 2/1992 |

* cited by examiner

Primary Examiner—Bruce Anderson
(74) Attorney, Agent, or Firm—Tarolli, Sundheim, Covell, Tummino & Szabo L.L.P.

(57) ABSTRACT

In a process for the irradiation of strand-shaped irradiated material (19; 19a–e), in particular cable insulation or sheathing (31) capable of being cross-linked by irradiation, or tubes, hoses, or profile elements capable of being cross-linked by irradiation, with electron beams impinging transversely to the longitudinal axis of the irradiated material (19; 19a–e), which strike the irradiated material (19; 19a–e) from two fixed irradiation directions (R1, R2), located at an angle to one another which is other than zero and for preference is a right angle, a uniform irradiation is achieved in a simple manner in that a scanned electron beam (17) is created from an electron beam (11) in a scanner (12) by means of a scan device (13), which by means of a temporally-actuated back-and-forth slewing movement in a prescribed angle range creates a radiation fan transversely to the longitudinal direction of the irradiated material, and that the scanned electron beam (17) is deflected by a deflection magnet (16, 16') arranged between the scan device (13) and the irradiated material (19; 19a–e) in such a way for each scan angle of the irradiation field that it impinges on the irradiation material (19; 19a–e) to be treated from one of the two fixed irradiation directions (R1, R2).

13 Claims, 2 Drawing Sheets

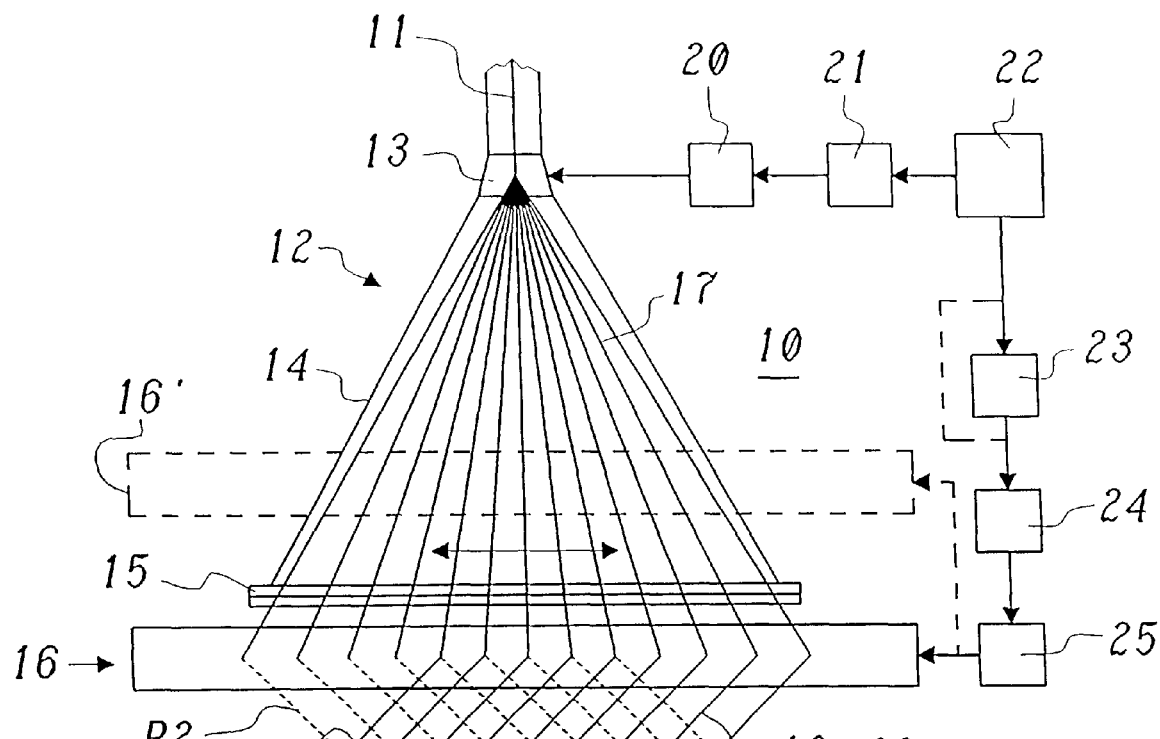
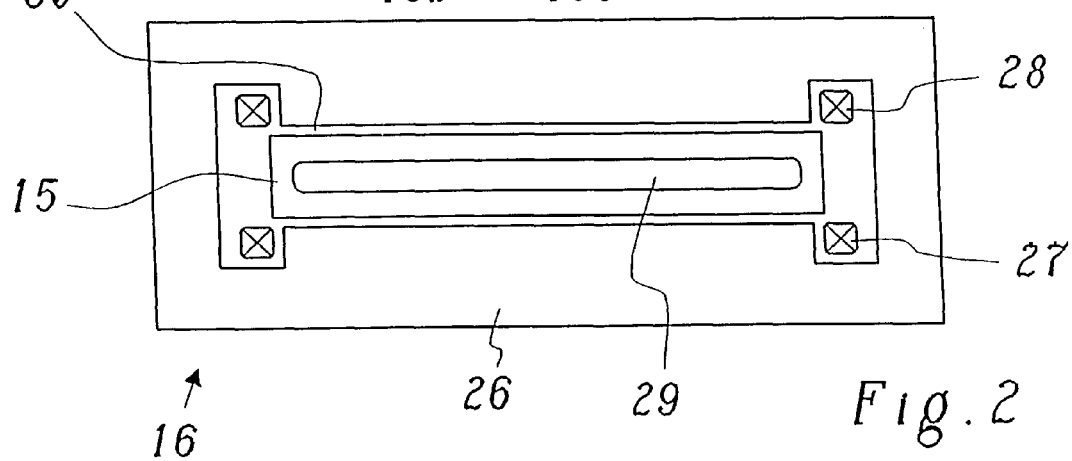
Fig. 1
Fig. 2

PROCESS FOR THE IRRADIATION OF STRAND-SHAPED IRRADIATED MATERIAL, AND AN IRRADIATING DEVICE FOR THE PERFORMANCE OF THE SAID PROCESS

TECHNICAL SECTION

The present invention relates to the sector of irradiation using electron beams. It further relates to a process for the irradiation of strand-shaped irradiated material, and in particular cable insulation or sheathing capable of cross-linking by radiation, or tubes, hoses, or profile elements capable of cross-linking by radiation, with electron beams impacting transversely to the longitudinal axis of the irradiated material, which impact on the irradiated material from two fixed irradiating devices located at an angle to one another which is other than zero degree, and for preference is a right angle.

It further relates to an irradiating device for the performance of the said process, which comprises first media for the generation of an electron beam, and second media which direct the electron beam form the two irradiating devices onto the bodies which are to be irradiated. Such a process and such a device are known, for example, from the earlier patent application from Applicant, PCT/CH 96/00052.

STATE OF THE ART

In the manufacture of cables, the cable sheaths or insulating casing is frequently made of rubber, polyolefins, or other cross-linkable polymers, and cross-linked after the sheathing of the interior of the cable in order to improve the thermal and mechanical stability. The cross-linking can in this case be effected by the addition of chemical ancillary substances, but also by irradiating with energy beams, and electron beams in particular. In the case of radiation-induced cross-linking, the matter involves, inter alia, the attaining of a continuous production process with acceptable expenditure on apparatus, in which cables or other irradiated materials running past the radiation source, such as tubes, hoses, or profile elements, receive uniform irradiation, which on the one hand will result in a uniform and complete cross-linking of all the parts and across the entire circumference of the irradiated material, and, on the other, will not incur any undesirable damage due to excessively high local radiation doses with subsequent electrical disruptive discharges.

Both in the patent specification referred to in the preamble, and in EP-A1-0 037 869, cross-linking induced by electron beam is described, in which the electron beams are directed from two irradiating devices located essentially vertical to one another onto the irradiated material which is to be cross-linked (referred to as "cross-firing") . The cross-firing process has a number of disadvantages, however, in the technical embodiments known hitherto: If, as shown in EP-A1-0 037 869 (FIG. 3), two radiation sources are used with downstream scanners in order to effect the irradiation from both the essentially orthogonal irradiating devices, this implies a considerable expenditure in terms of apparatus, because two vacuum devices, two high-voltage and high-current supplies for the electron beam sources and scanning devices respectively in the scanners, and the pertinent vacuum devices are required. If, by contrast, as is shown in FIG. 1 of PCT/CH 96/00052, the beam is divided from one electron beam source and conducted via separate beam guides to two scanners, which direct the beam in temporal packages onto the irradiated material to be cross-linked from the two irradiating devices, it is at present still not possible to use standard apparatus consisting of source and scanners which is commercially tenable. Rather, special apparatus must be created, which requires considerable expenditure.

PRESENTATION OF THE INVENTION

The objective of the invention is therefore to provide a process for radiation cross-linking of strand-shaped irradiated material, such as cores, cables, tubes, hoses, profile elements and the like, which can be applied by the use of only slightly modified standard components in a simple manner, and which at the same time is characterised by homogenous irradiation results, as well as an irradiating device for the performance of the said process.

This objective is achieved by a process of the type referred to in the preamble in that a scanned electron beam is created from an electron beam in a scanner by means of a scanning device which creates a radiation fan by means of the temporally-controlled slewing backwards and forwards in a predetermined angle range transversely to the longitudinal direction of the irradiated material, and that the scanned electron beam is deflected by means of a deflector magnet arranged between the scanning device and the irradiated material, for each scanning angle of the radiation field, in such a way that it impinges on the irradiated material which is to be treated from one of the two fixed irradiation devices. The core of the invention lies in the fact that the scanned electron beam, scanned transversely to the longitudinal direction of the irradiated material by means of additional deflection, optionally into the two desired irradiation directions. In this way it is possible, with one single standard piece of apparatus, consisting of electron beam source and scanner, and with only one additional deflection device, to achieve the cross-firing process simply and economically.

In principle, it is conceivable that a permanent magnet or an electromagnet operated with a constant magnetic current can be used as the deflection magnet. The deflection magnet must then provide differing magnetic field strengths and directions at different places along the direction of the scan, in order that, depending on the scan angle, it is possible to achieve deflection of differing strengths, moving in different directions, of the scanned electron beam in the deflection magnet. This means, however, a relatively complex layout of the deflection magnet, which can only be adjusted with difficulty if changes are effected in the beam system.

A preferred embodiment of the process according to the invention is therefore characterised in that a controllable electromagnet is used as the deflection magnet, which in the area of the fan-shaped radiation field creates an essentially homogenous magnetic field of controllable magnetic field strength and direction, and that the magnetic field strength and direction are changed synchronously to the deflection of the electron beam in the scan direction of the scanner in such a way that the electron beam deflected in the magnetic field of the deflection magnet impinges on the irradiated material from one of the two irradiation devices. The homogenous magnetic field can be created relatively simply. By the temporal control of the magnetic field strength, it is easily possible, with electronic media, at any time, which simultaneously determines a specific scan angle for the scanned electron beam, at which the beam runs through the scanner, an appropriate deflection angle can be attained in the deflection magnet. If the parameters in the electron source or in the scanner change, the device can be readjusted by simple adaptations in the control device.

For preference, the scanning device in the scanner deflects the electron beam with a scan frequency fHd s, and the deflection magnet alters the magnetic field with a magnetic field frequency $f_B$, which is greater, smaller, or equal to the scan frequency $f_s$; i.e. the function $f_B = k \cdot f_s$, applies, with k as any desired number other than zero.

According to a first further embodiment, $f_B = f_s$, and when the scanned electron beam is slewed away, it is deflected into one irradiation direction, and when it is slewed back it is deflected into the other irradiation direction. As a result, the irradiated material is irradiated from both irradiation directions in each scan period.

A further development of this embodiment is characterised by $f_B = f_s/n$ where $n = 2, 3, 4, \ldots$, and that the scanned electron beam in n-times slewing backwards and forwards of the scanned electron beam is deflected in each case in one irradiation direction and, in the subsequent n-times slewing backwards and forwards, is deflected in the other irradiation direction.

A further preferred embodiment of the process according to the invention is characterised in that the irradiated material is moved in the longitudinal direction relative to the scanner at a speed v, that the beam fan created by the scanner, measured at the height of the irradiated material and in the longitudinal direction of the irradiated material, featured a width W, and that the deflection magnet is operated at a minimum magnetic field frequency $f_{Bmin}$, which satisfies the equation $f_{Bmin} = v/W$.

The irradiation device according to the invention for the performance of the process is characterised in that the second media comprises a scanner arranged essentially transverse to the longitudinal direction of the irradiated material, and a deflection magnet for deflecting the scanned electron beam.

A preferred embodiment of the device according to the invention is characterised in that the deflection magnet is an electromagnet capable of being controlled in terms of magnetic field strength and direction, which creates an essentially homogenous magnetic field for the deflection of the scanned electron beam, that actuation media are provided for the deflection magnet, which control the magnetic field strength and direction of the deflection magnet in such a way that the electron beam deflected by the deflection magnet always impinges on the material to be irradiated from one of the two irradiation devices, that the scanner comprises a scan device which is actuated with a scan frequency $f_s$, created in an oscillator, that the actuation media for synchronisation stand in an operational connection with the oscillator, and that the actuation media comprise a frequency divider and a function generator. With the aid of the frequency divider, switchover between the irradiation directions can be effected at a frequency which is only a fraction of the scan frequency. The function generator allows for the precise control of the temporal sequence of the magnetic field in the deflection magnet.

Further embodiments can be derived from the dependent claims.

BRIEF EXPLANATION OF THE FIGURES

The invention is explained in greater detail on the basis of embodiment examples in connection with the drawings. These show:

FIG. 1 In a simplified representation, in a side view, an irradiation device according to a preferred embodiment of the invention;

FIG. 2 The scanner with the deflection magnet from FIG. 1, in a view from below.

WAYS FOR IMPLEMENTING THE INVENTION

Figure 3:
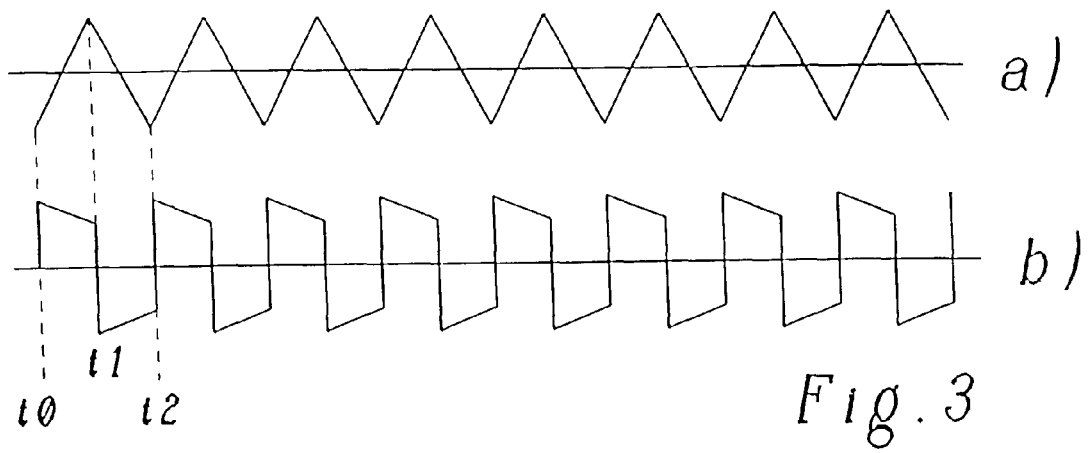
FIGS. 3–5 The temporal sequence of the control signals for the scan device in the scanner (in each case, part figure a) and for the deflection magnet (in each case part figure b) for differing frequency relationships between the scan frequency and the deflection magnet frequency with the device according to FIG. 1.

FIG. 1 shows a simplified representation in a side view of an irradiation device according to a preferred embodiment of the invention. The irradiation device 10 obtains a single electron beam 11 from an electron beam source (not shown), which enters into a scanner 12, and at that point is deflected in an inherently known manner by means of an integrated (magnetic) scan device 13 to form a beam fan. The beams shown in FIG. 1 inside the scan funnel 14, which extends in fan fashion, represent the beam input of the (one) scanned electron beam 17 at different moments in time. The scanned electron beam 17 slews in temporal sequence in the direction of the double arrow shown in the figure, backwards and forwards between the two maximum scan angles, and emerges downwards through an outlet window 15, at a constantly changing scan angle from the scan funnel 14. The scanned electron beam 17 should now be influenced or deflected respectively in such a way that it impinges on the irradiated material 19, to be irradiated or cross-linked, which is arranged with its longitudinal direction perpendicular to the plane of the drawing beneath the outlet window 15, and is moved away perpendicular to the plane of the drawing at a speed v beneath the scanner 12, beneath two fixed irradiation directions R1 and R2, located for preference perpendicular to one another. The one irradiation direction R1 is indicated in FIG. 1 by the continuous lines, and the other irradiation device R2 by dotted lines.

The irradiated material 19 in the example represented in FIG. 1 consists of a plurality of irradiated material sections or cable sections 19a–e of a cable with a cable sheath 31, arranged parallel to one another in an irradiation plane 32. The cable is deflected by corresponding rollers or drums, and conducted several times at the same speed v beneath the scanner 12, but in changing directions, as shown, for example, in U.S. Pat. No. 3,925,671 or in EP-A1-0 037 869. Depending on the type of deflection, in this situation the cable will be irradiated alternatively from above and from below, depending on the direction of the run, with the result that uniform irradiation is achieved over the entire circumference. This configuration applies by analogy to other strand-shaped irradiation materials such as tubes, hoses, or profile elements etc.

To influence or deflect the scanned electron beam 17, provision is made for a deflection magnet 16, incorporated as a controllable electromagnet, the arrangement of which can be seen from the view from below shown in FIG. 2. The deflection magnet 16 consists of two magnetic coils 27 and 28 arranged parallel to one another (which are not shown in FIG. 1 in order to provide a better overview), which lie within an encompassing magnetic yoke 26. The magnetic yoke 26, which consists essentially of a packet of plates, has an air gap 30 between the magnetic coils 27 and 28, in which a predominantly homogenous magnetic field prevails. Through this air gap 30, the scanned electron beam 17 passes from top to bottom, out of the outlet window 15, which is closed off by a thin metal foil 29 as a vacuum barrier, and is deflected by the magnetic field prevailing in the air gap 30, depending on the polarity and strength of the magnetic field, by differing angles to the right or to the left (FIG. 1).

The magnetic field strength varies in this context with the scan angle: If the scanned electron beam 17 is located close to the right-hand side wall of the scan funnel 14, then the angle by which the scanned electron beam 17 must be deflected to the left (irradiation direction R1) is the maximum; respectively, the angle which encompasses the scanned electron beam 17 with the deflected electron beam 18 is the minimum. The same applies if the scanned electron beam 17 is located close to the left side wall of the scan funnel 14 and the electron beam must be deflected to the right (irradiation direction R2, the dotted line in FIG. 1). If the scanned electron beam 17 now migrates from the right to the left side of the scan funnel 14, the angle by which the beam must be deflected into the first irradiation direction R1 will become increasingly smaller. The same applies to the deflection into the second irradiation direction R2, when the beam conversely migrates from the left to the right side.

Because the deflection angle of the electron beam in the deflection magnet 16 rises with the strength of the magnetic field, and vice-versa, it is possible, by means of a change in the magnetic field which is temporally synchronised change with the scan process, to impose on the scanned electron beam 17, in any position which it adopts in the scanner 12, by the corresponding control of the magnetic field strength and polarity of the magnetic field (or the magnetic induction respectively), just such a deflection as will cause the deflected electron beam 18 to broaden in one of the two irradiation directions R1 or R2, as is made clear in FIG. 1 by the different beam paths indicated. If instead of the deflection magnet 16 arranged between the outlet window 15 and the irradiated material 19 in FIG. 1 (shown as dotted lines), a deflection magnet 16' is placed between the scan device 13 and the outlet window 15, the scanned electron beam 17 will already be deflected in the scan funnel 14 in the vacuum, which in respect of the scatter of the electrons incurs certain advantages. On the other hand, in this case, special requirements must be imposed on the wall material used for the scan funnel 14 in respect of its magnetic properties.

Figure 4:
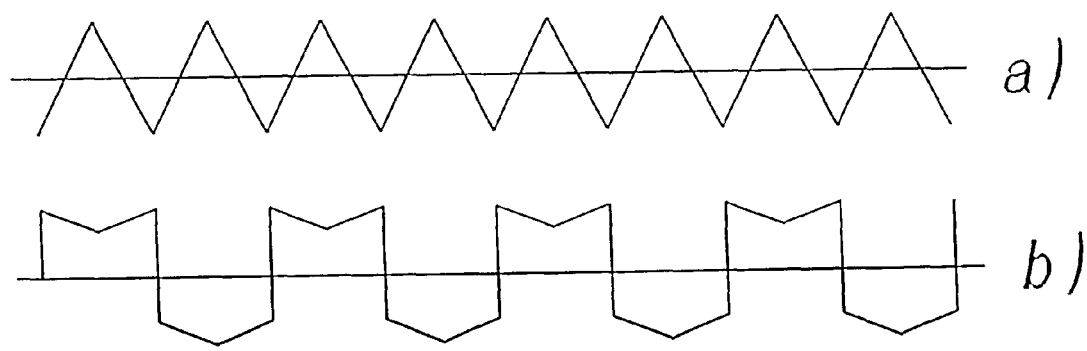
Figure 5:
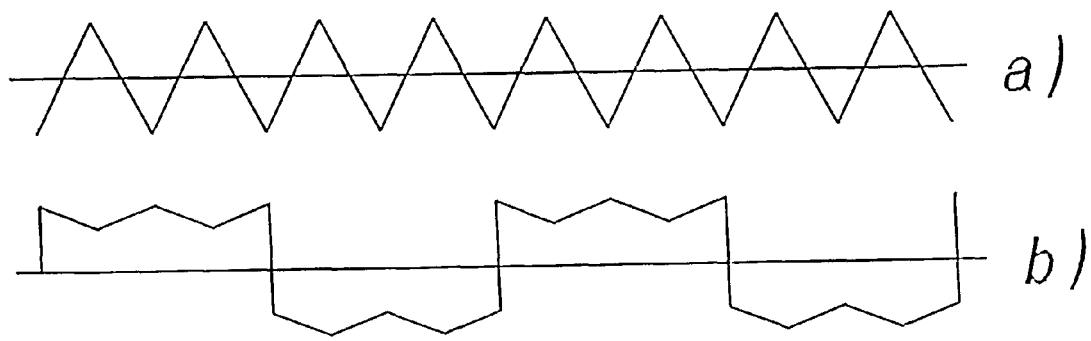

The synchronous control is effected according to FIG. 1 for example by the fact that both the scan device 13 in the scanner 12, as well as the deflection magnet 16 or 16' respectively, are controlled according to a common pulse frequency from an oscillator 22. From the oscillator frequency, which is, for example, equal to the scan frequency $f_s$, the delta wave signal shown in the part figures a in FIGS. 3 to 5 is derived in a sawtooth generator 21, and is passed on to a power output element 20 in order to control the scan device 13, the said power output element providing the magnetic current necessary for the scan device 13. At the same time, the oscillator frequency is conducted either directly to a pulse shaper 24, or, in the event of the magnetic field frequency being smaller than the scan frequency (as is shown in FIG. 1), an adjustable phase-synchronised magnetic field frequency $f_B=f_s/n$, where n=2,3,4 . . . , is created from the oscillator frequency by division in a frequency divider 23.

From the oscillator frequency or the displaced magnetic field frequency, periodic signal sequences are created in a function generator 24, as shown in the part figures b of FIGS. 3 to 5. FIG. 3 shows in this context the situation with $f_B=f_s$, FIG. 4 the case with $f_B=1/2f_s$, and FIG. 5 shows the situation with $f_B=1/4f_s$. The signal sequences then control a power output element 25, which provides the current for the magnetic coils 27, 28 of the deflection magnet 16. The magnetic field frequency $f_B$ in this situation is equal to the frequency at which the deflection magnet 16 is operated. If the magnetic field frequency $f_B$ is by contrast greater than the scan frequency $f_s$, it is possible to use a corresponding frequency multiplier instead of the frequency divider 23.

In order to achieve a uniform distribution of the irradiation dose, the irradiated material 19 being moved through beneath the scanner 12 must be irradiated at least once from each irradiation direction per pass, which requires a minimum magnetic field frequency $f_{Bmin}$, which satisfies the equation $f_{Bmin}=v/W$. In this context, v corresponds to the speed with which the irradiated material 19 or the irradiated material or cable sections 19a–e are moved in the longitudinal direction relative to the scanner 12. w is the width which the radiation fan shapes created by the scanner 12 features when measured at the height of irradiated material 19 (in the irradiation plane 32) and in the longitudinal direction of the irradiated material 19.

The synchronous control of the scanner 12 or scan device 13 and deflection magnet 16 can be explained simply by means of FIG. 3: From the moment 10 to the moment 11, the delta wave signal from part FIG. 3(a) has a rising flank, which, for example, causes the slewing of the scanned electron beam 17 from the left to the right side. At the same time, the signal sequence from part FIG. 3(b) has a flank which lies in a positive position, falling away obliquely. This flank signals a deflection becoming weaker into the second irradiation direction R2. At the moment 11, the scan procedure reverses and the scanned electron beam 17 changes with the dropping flank of the delta wave signal from the right to the left side, until it has reached this side at the moment 12, and again vice-versa. At the same time, the signal sequence from FIG. 3(b) has a flank located in a negative position, with an obliquely rising flank. This flank signals a weakening deflection in the first irradiation direction R1. From the moment 12 the (periodic) procedure begins anew. In the case represented in FIG. 4, the scanned electron beam 17 is left in each case in one of the irradiation directions R1 or R2 for one complete back and forth movement. With the case represented in FIG. 5, the irradiation direction remains constant for two complete back-and-forth movements. If the magnetic field of the deflection magnet 16 is not homogenous, or if the angular velocity of the scanned electron beam 17 is not constant when moving back and forth in the scanner 12, it is possible, by adjusting the function generator 24, for the signal shape for actuating the deflection magnet 16 at any time in such a way that the condition is always fulfilled, that the deflected electron beam 18 is located in one of the two irradiation directions R1 and R2. In this way, it is possible for a cross-firing process with very uniform irradiation to be achieved with a conventional scanner combination by adding a deflection magnet.

EXAMPLE

The following values can be assumed by way of example for an irradiation device which can be used in cable production:

Electron source/scanner:

| | |
|---|---|
| Adjustable energy range of the electrons | 1000–3000 keV |
| Usable radiation current range | 0–40 mA |
| Usable electron beam power | 0–120 kW |
| Scan angle of the oscillating electron beam | ±30 degrees |
| Scan frequency | 100 Hz |
| Scan length at the outlet window 15 | 920 mm |

-continued

Electron source/scanner:

| | |
|---|---|
| Distance from outlet window 15 to the plane of the product | 200 mm |
| Width of the product plane | 1000 mm |

Deflection magnet
- Low structural height ($\leq 100$ mm) beneath the scanner 12;
- As far as possible, parallel B-field in the deflection range with a clear width of 250 mm (air gap 30);
- Magnetic induction B in the range from 0.02 to 0.20 Tesla for 3-MeV electrons at a structural height of the deflection magnet 16 of 100 mm;
- Cooling of the deflection magnet for preference with air or water.

Overall, the invention provides a new irradiation process and an irradiation device in which, by means of a dynamic "cross-firing" system, and making use of conventional systems and comparatively low additional expenditure, an efficient and uniform irradiation of strand-shaped irradiation materials is possible in a simple manner.

Reference number list

| | |
|---|---|
| 10 | Irradiation device |
| 11 | Electron beam |
| 12 | Scanner |
| 13 | Scan device |
| 14 | Scan funnel |
| 15 | Outlet window |
| 16,16' | Deflection magnet |
| 17 | Scanned electron beam |
| 18 | Deflected electron beam |
| 19 | Irradiated material (cable) |
| 19a–e | Section of irradiated material (cable section) |
| 20,25 | Power output element |
| 21 | Sawtooth generator |
| 22 | Oscillator |
| 23 | Frequency divider |
| 24 | Function generator |
| 26 | Magnetic yoke (sheet packet) |
| 27,28 | Magnetic coil |
| 29 | Metal film |
| 30 | Air gap |
| 31 | Cable sheath |
| 32 | Irradiation plane |
| $f_B$ | Frequency of deflection magnet |
| $f_S$ | Scan frequency |
| R1,R2 | Direction of irradiation |

What is claimed is:

1. The process for the irradiation of strand-shaped irradiated material (19; 19*a–e*) which are cross-linked by radiation, the process comprising the steps of:
   generating a scanned electron beam (17) from a single electron beam (11) in a scanner (12) by means of a scan device (13);
   generating a fan-shaped radiation field by means of a temporally-controlled back-and-forth slewing movement over a specific angle range transverse to the longitudinal direction of the irradiated material (19; 19*a–e*);
   deflecting the scanned electron beam (17) by a deflection magnet (16, 16') arranged between the scan device (13) and the irradiated material (19; 19*a–e*) for every scan angle of the fan-shaped radiation field; and
   impinging the irradiated material (19; 19*a–e*) with the deflected scanned electron beam (17) from two fixed irradiating directions (R1,R2) located at an angle to one another which is other than zero.

2. The process according to claim 1 wherein the deflection magnet (16, 16') is a controllable electromagnet, the controllable electromagnet creating a controllable magnetic field strength and direction in a homogeneous magnetic field in an area of the fan-shaped radiation field, and wherein the step of deflecting the electron beam (17) includes the step of synchronously changing the magnetic field strength and direction with the scan direction of the scanner (12) in such a way that the electron beam (18) deflected in the magnetic field of the deflection magnet (16, 16') impinges on the irradiated material (19; 19*a–e*) from one of the two irradiating directions (R1, R2).

3. The process according to claim 2 wherein the scan device (13) in the scanner (12) deflects the electron beam (11) with a scan frequency $f_s$, and wherein the deflection magnet (16, 16') changes the magnetic field with a magnetic field frequency $f_B$ which is greater, smaller, or equal to the scan frequency $f_s$.

4. The process according to claim 3 wherein $f_B = f_s$, and wherein the scanned electron beam (17) is deflected into one of the fixed irradiation directions (R1, R2) when the scanned electron beam is slewed away, and the scanned electron beam (17) is deflected into the other of the fixed irradiation directions (R1, R2) when the scanned electron beam (17) is slewed back.

5. The process according to claim 3 wherein $f_B = f_s/n$ where $n = 2, 3, 4, \ldots$, and that the scanned electron beam (17), at n-times back-and-forth slewing movement of the scanned electron beam (17) is deflected in each case into one of the fixed irradiation directions (R1, R2) and at the subsequent n-times back-and-forth slewing movement, the scanned electron beam (17) is in each case deflected into the other of the fixed irradiation directions (R1, R2).

6. The process according to claim 3 wherein the irradiated material (19; 19*a–e*) is moved in the longitudinal direction relative to the scanner (12) at a speed v, the fan-shaped radiation field generated by the scanner (12) at the height of the irradiated material (19; 19*a–e*) and in the longitudinal direction of the irradiated material (19; 19*a–e*) has a width W, the deflection magnet (16, 16') being operated at a minimum magnetic field frequency $f_{Bmin}$, which satisfies the equation $f_{Bmin} = v/W$.

7. An irradiation device (10) for irradiating strand-shaped irradiated material (19; 10*a–e*) which is cross-linked by radiation, the device (10) comprising:
   a first media for supplying an electron beam (11),
   a second media located between the first media and the irradiated material (19; 19*a–e*) for deflecting the electron beam (11) from two irradiation directions (R1, R2) located at an angle to one another which is other than zero onto the irradiated material (19; 19*a–e*) to be treated,
   the second media comprising a scanner (12) arranged transversely to the longitudinal direction of the irradiated material (19; 19*a–e*) and a deflection magnet (16, 16') for deflecting a scanned electron beam (17).

8. The irradiation device according to claim 7 wherein the deflection magnet (16, 16') is an electromagnet having a controlled magnetic strength and direction, the electromagnet generating a homogeneous magnetic field for the deflection of the scanned electron beam (17), and
   actuation media (23, 24, 25) for controlling the magnetic field and direction of the deflection magnet (16, 16') so that the scanned electron beam (18) deflected by the deflection magnet (16, 16') always impinges on the irradiated material (19; 19*a–e*) to be treated from one of the two irradiation directions (R1, R2).

9. The irradiation device according to claim 8 wherein the deflection magnet (16, 16') comprises two magnetic coils (27, 28) arranged in parallel, between which the scanned electron beam (17) passes, the two magnetic coils (27, 28) are arranged on a magnetic yoke (26), the yoke (26) having an air gap (30) between the magnetic coils (27, 28) for the passage of the scanned electronic beam (17).

10. The irradiation device according to claim 9 wherein the deflection magnet (16, 16') is arranged between the scanner (12) and the irradiated material (19; 19*a–e*) to be treated.

11. An irradiation device for irradiating strand-shaped irradiated material which is cross-linked by radiation, the device comprising:

a first media for supplying an electron beam, a second media for deflecting the electron beam from two irradiation directions located at an angle to one another which is other than zero onto the irradiated material to be treated, the second media comprising a scanner arranged transversely to the longitudinal direction of the irradiated material and a deflection magnet for deflecting a scanned electron beam, the deflection magnet being an electromagnet having a controlled magnetic strength and direction, the magnet generating a homogenous magnetic field for the deflection of the scanned electron beam, and a actuation media for controlling the deflection magnet so that the scanned electron beam deflected by the deflection magnet always impinges on the irradiated material to be treated from one of the two irradiation directions, the scanner comprising a scan device actuated at a scan frequency $f_s$ generated in an oscillator, the actuation media being connected to the oscillator for synchronization of the scan device.

12. The irradiation device according to claim 11 wherein the actuation media includes a frequency divider and a function generator.

13. An irradiation device for irradiating strand-shaped irradiated material which is cross-linked by radiation, the device comprising:

a first media for supplying an electron beam, a second media for deflecting the electron beam from two irradiation directions located at an angle to one another which is other than zero onto the irradiated material to be treated, the second media comprising a scanner arranged transversely to the longitudinal direction of the irradiated material and a deflection magnet for deflecting a scanned electron beam, the deflection magnet being an electromagnet having a controlled magnetic strength and direction, the magnet generating a homogenous magnetic field for the deflection of the scanned electron beam, and actuation media for controlling the deflection magnet so that the scanned electron beam deflected by the deflection magnet always impinges on the irradiated material to be treated from one of the two irradiation directions, the deflection magnet comprising two magnetic coils arranged in parallel, between which the scanned electron beam passes, the two magnetic coils being arranged on a magnetic yoke, the yoke having an air gap between the magnetic coils for the passage of the scanned electronic beam, the scanner having a scan device for deflecting the electron beam entering into the scanner from which the scanned electron beam emerges, the deflection magnet being arranged between the scan device and an outlet window.

\* \* \* \* \*